United States Patent [19]
Nagata

[11] Patent Number: 6,061,281
[45] Date of Patent: May 9, 2000

[54] REDUNDANCY METHOD AND SEMICONDUCTOR CIRCUIT

[75] Inventor: Kyoichi Nagata, Tokyo, Japan

[73] Assignee: NEC Corporation, Tokyo, Japan

[21] Appl. No.: 09/193,358

[22] Filed: Nov. 17, 1998

[30] Foreign Application Priority Data

Nov. 27, 1997 [JP] Japan ..................... 9-326229

[51] Int. Cl.⁷ ..................................... G11C 7/00

[52] U.S. Cl. ................. 365/200; 365/230.03; 365/201

[58] Field of Search ............... 365/200, 230.03, 365/201

[56] References Cited

U.S. PATENT DOCUMENTS 5,270,976 12/1993 Tran .......................................... 365/200
5,914,907 6/1999 Kobayashi et al. ................ 365/230.03

Primary Examiner—David Nelms
Assistant Examiner—Connie C. Yoha
Attorney, Agent, or Firm—Scully, Scott Murphy & Presser

[57] ABSTRACT

In a redundancy method, a redundancy switch is shared by a plurality of redundancy objects. The redundancy switch is divisionally, independently connected to recovery lines in the redundancy objects by a plurality of redundancies in the redundancy switch. Defects generated in the redundancy objects are replaced with information of the recovery lines in the redundancy objects that are connected to the redundancy switch, thereby recovering the defects. A semiconductor circuit for the above method is also disclosed.

12 Claims, 5 Drawing Sheets

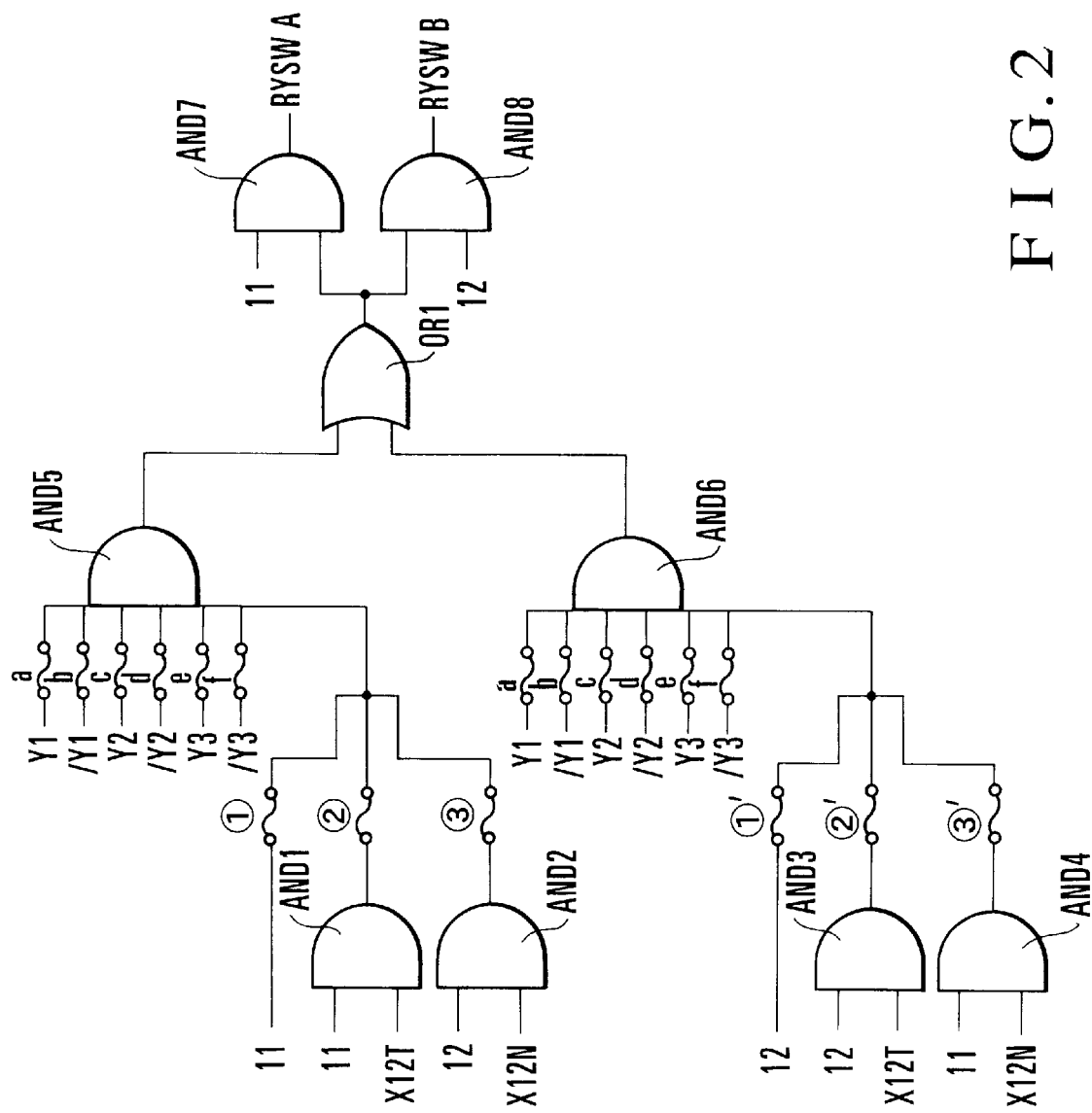
F I G. 2

REDUNDANCY METHOD AND SEMICONDUCTOR CIRCUIT

BACKGROUND OF THE INVENTION

The present invention relates to a semiconductor circuit and, more particularly, to a semiconductor circuit having a redundancy function.

FIG. 5 shows a Y redundancy arrangement as an example of a semiconductor circuit having a conventional redundancy function.

As shown in FIG. 5, in the conventional semiconductor circuit, two redundancy switches 121 and 122 arranged between two memory banks (redundancy objects) 111 and 112 are connected to recovery lines RYSWA, RYSWB, RYSWC, and RYSWD for the memory banks 111 and 112. The redundancy switch 121 selects the recovery line RYSWA or RYSWB. The redundancy switch 122 selects the recovery line RYSWC or RYSWD.

In the semiconductor circuit having this arrangement, for example, when one defect is generated in each of the banks 111 and 112, the redundancy switch 121 selects the recovery line RYSWA, and the redundancy switch 122 selects the recovery line RYSWD. When two defects are generated in the bank 111, the redundancy switch 121 selects the recovery line RYSWA, and the redundancy switch 122 selects the recovery line RYSWC. When two defects are generated in the bank 112, the redundancy switch 121 selects the recovery line RYSWB, and the redundancy switch 122 selects the recovery line RYSWD.

In this manner, when defects are generated in the banks 111 and 112, the redundancy switches 121 and 122 select connection to the recovery lines RYSWA, RYSWB, RYSWC, and RYSWD in accordance with the defective banks. Any of the recovery lines RYSWA, RYSWB, RYSWC, and RYSWD that are connected to the redundancy switches 121 and 122 replace the defects to recover the generated defects.

In the conventional semiconductor circuit described above, since the four recovery lines for the banks are connected to the two redundancy switches arranged between the two banks, the number of redundancy switches are large, requiring a large area of the semiconductor circuit.

SUMMARY OF THE INVENTION

The present invention has been made to solve the above problems of the prior art, and has as its object to provide a semiconductor circuit capable of increasing the redundancy efficiency without increasing the circuit area.

To achieve the above object, according to the present invention, there is provided a redundancy method comprising the steps of sharing a redundancy switch by a plurality of redundancy objects, such as memory banks or memory blocks, divisionally, independently connecting the redundancy switch to recovery lines in the redundancy objects by a plurality of redundancies in the redundancy switch, and replacing defects generated in the redundancy objects with information of the recovery lines in the redundancy objects that are connected to the redundancy switch, thereby recovering the defects.

BRIEF DESCRIPTION OF THE DRAWINGS

FIG. 2 is a circuit diagram showing an example of the arrangement of a redundancy switch shown in FIG. 3A;

DESCRIPTION OF THE PREFERRED EMBODIMENT

Figure 3A:
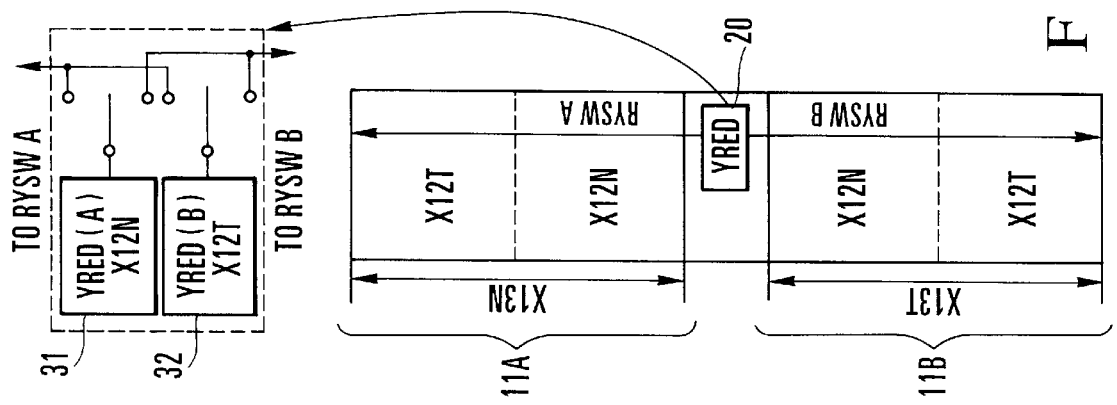
FIG. 3A is a view showing the layout when the redundancy switch for recovering a defect generated in a bank is arranged between two banks on the same chip as the banks.

An embodiment of the present invention will be described below with reference to the accompanying drawings. FIG. 3A shows a Y redundancy arrangement in a semiconductor circuit having a redundancy function according to an embodiment of the present invention.

As shown in FIG. 3A, in this embodiment, a redundancy switch 20 for recovering defects generated in two memory banks (redundancy objects) 11 and 12 is arranged between the banks 11 and 12 on the same chip as the banks 11 and 12. The redundancy switch 20 comprises redundancies 31 and 32 as first and second recovery means for recovering defects at upper and lower addresses in the banks 11 and 12. The redundancies 31 and 32 can independently switch connection to recovery lines RYSWA and RYSWB each for either one of the two different banks 11 and 12.

Redundancy operation in the semiconductor circuit having this arrangement will be described in detail.

Figure 1C:
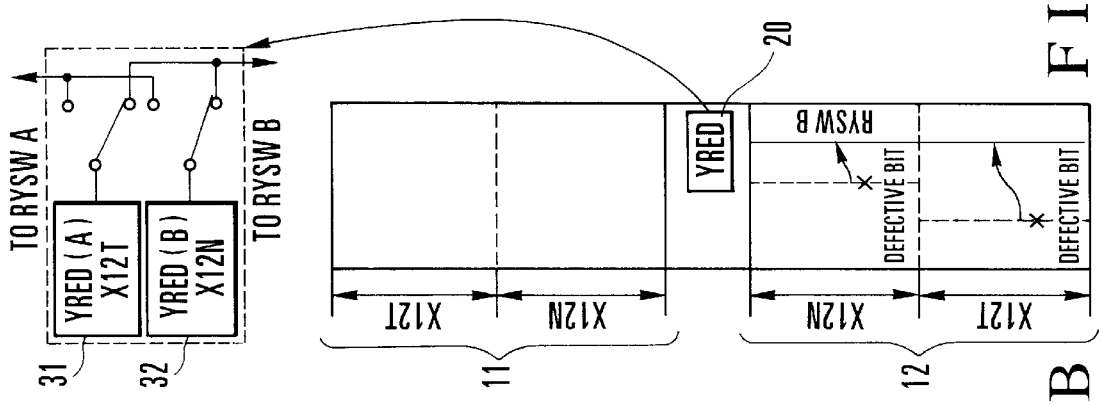
FIGS. 1A, 1B, and 1C are diagrams for explaining characteristic operation in a semiconductor circuit with a redundancy function shown in FIG. 3A.
Figure 1B:
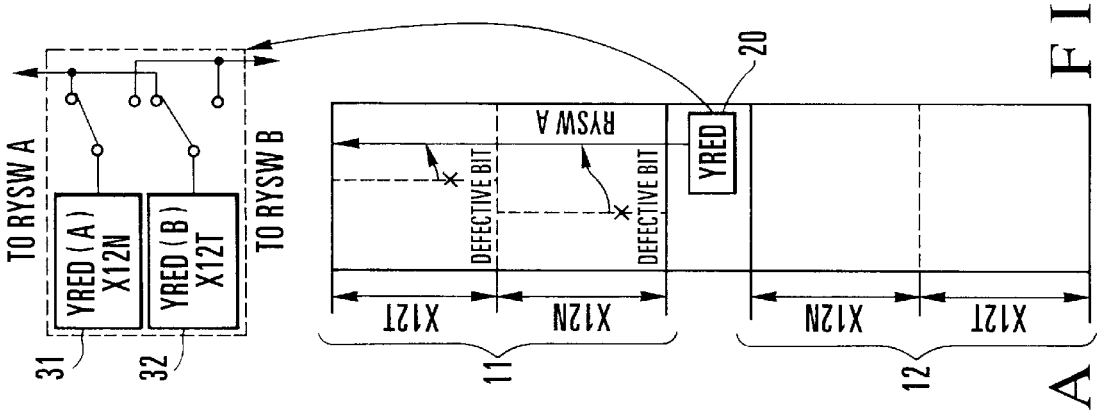
Figure 1A:
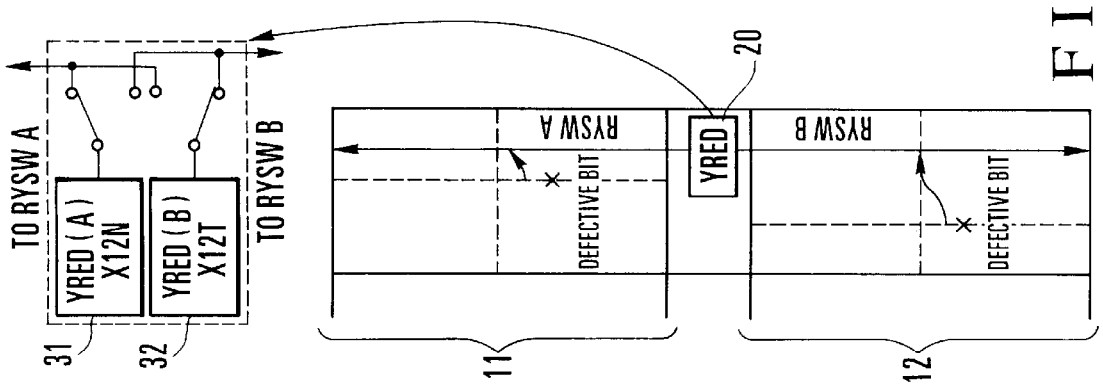

[(1) Generation of Defects in Banks 11 and 12: see FIG. 1A]

The redundancy 31 is connected to the recovery line RYSWA on the bank 11 side, whereas the redundancy 32 is connected to the recovery line RYSWB on the bank 12 side. A defect generated in the bank 11 is replaced with information of the recovery line RYSWA connected to the redundancy 31, and a defect generated in the bank 12 is replaced with information of the recovery line RYSWB connected to the redundancy 32.

Accordingly, the defect generated in the bank 11 is recovered by the redundancy 31, and the defect generated in the bank 12 is recovered by the redundancy 32.

[(2) Generation of Defects at Upper and Lower Addresses in Bank 11: see FIG. 1B]

The redundancies 31 and 32 are connected to the recovery line RYSWA on the bank 11 side. A defect generated at an upper address in the bank 11 is replaced with information of the recovery line RYSWA connected to the redundancy 31. A defect generated at a lower address in the bank 11 is replaced with information of the recovery line RYSWA connected to the redundancy 32.

As a result, the defect generated at the upper address in the bank 11 is recovered by the redundancy 31, and the defect generated at the lower address in the bank 11 is recovered by the redundancy 32.

[(3) Generation of Defects at Upper and Lower Addresses in Bank 12: see FIG. 1C]

The redundancies 31 and 32 are connected to the recovery line RYSWB on the bank 12 side. A defect generated at an upper address in the bank 12 is replaced with information of the recovery line RYSWB connected to the redundancy 31. A defect generated at a lower address in the bank 12 is replaced with information of the recovery line RYSWB connected to the redundancy 32.

Then, the defect generated at the upper address in the bank 12 is recovered by the redundancy 31, and the defect generated at the lower address in the bank 12 is recovered by the redundancy 32.

The arrangement of the above-mentioned redundancy switch 20 will be explained. FIG. 2 shows an example of the arrangement of the redundancy switch 20 shown in FIGS. 1A, 1B, and 1C.

As shown in FIG. 2, the redundancy switch 20 in this embodiment is made up of a plurality of AND gates AND1 to AND8, an OR gate OR1, and fuses ①to ③, ①' to ③', and a to f. The fuses are disconnected in accordance with the defective bank and defect address.

When defects are generated as shown in FIG. 1A, the fuses ②, ③, ②', and ③' shown in FIG. 2 are disconnected. When defects are generated as shown in FIG. 1B, the fuses ①, ③, ①', and ②' are disconnected. When defects are generated as shown in FIG. 1C, the fuses ①, ②, ①', and ③' are disconnected.

In a defect address memory portion constituted by the AND gates AND5 and AND6, fuses are disconnected in accordance with the address of the generated defect. For example, when the defect addresses are Y1, /Y2, and Y3, the fuses b, c, and f are disconnected.

Figure 3B:
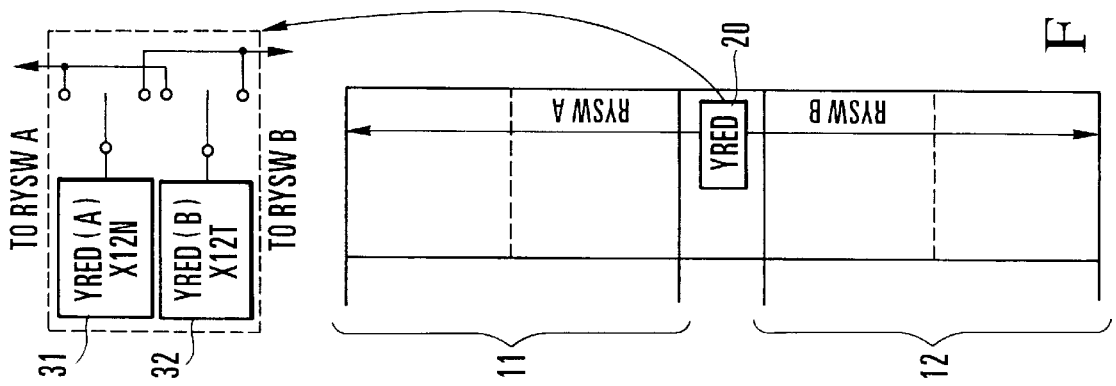
FIG. 3B is a view showing the layout when the bank is divided into two blocks by address X, and the redundancy switch for recovering a defect generated in the bank is arranged between the divided blocks.
Figure 4:
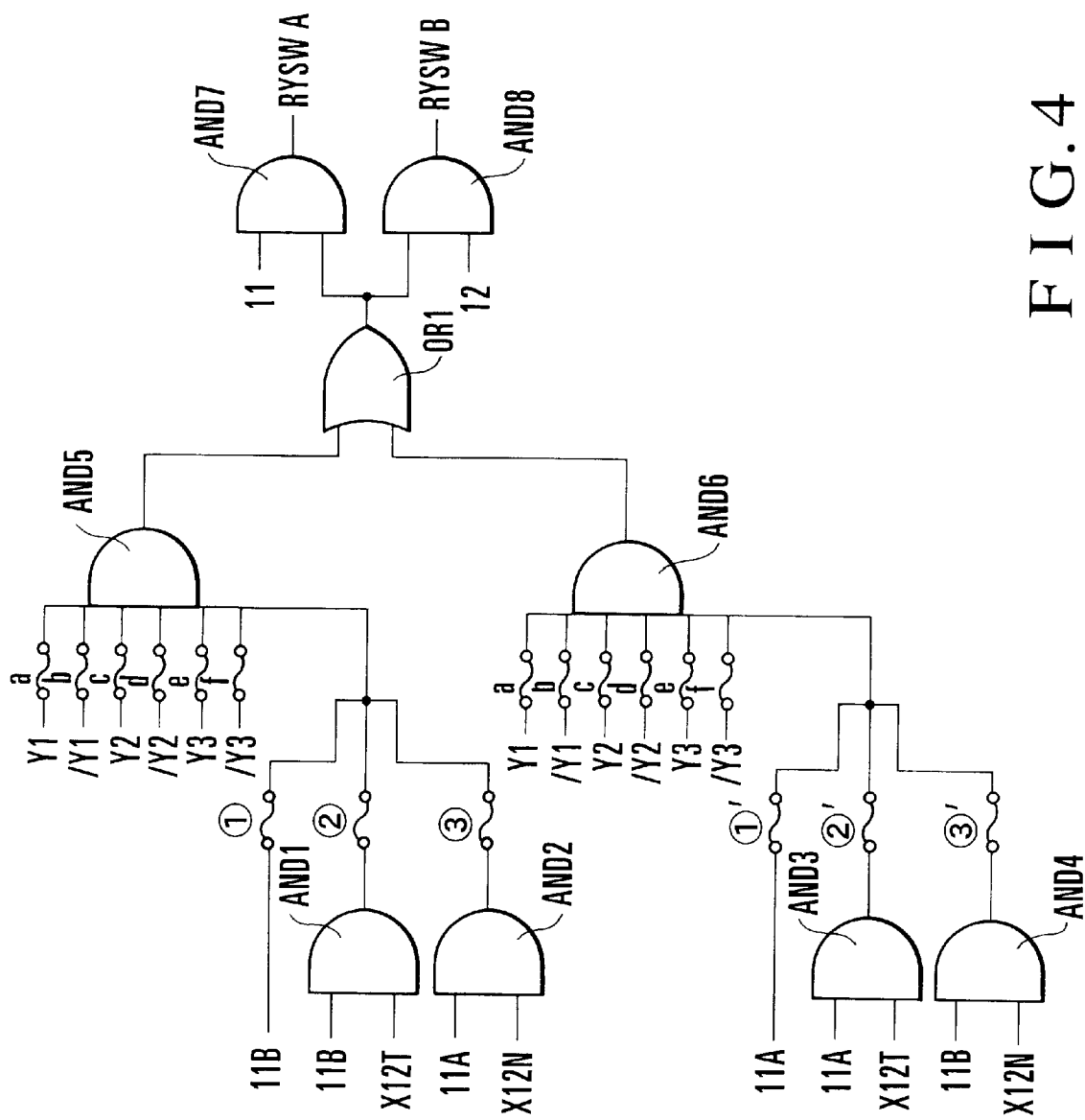
FIG. 4 is a circuit diagram showing the arrangement of the redundancy switch shown in FIG. 3B.
Figure 5:
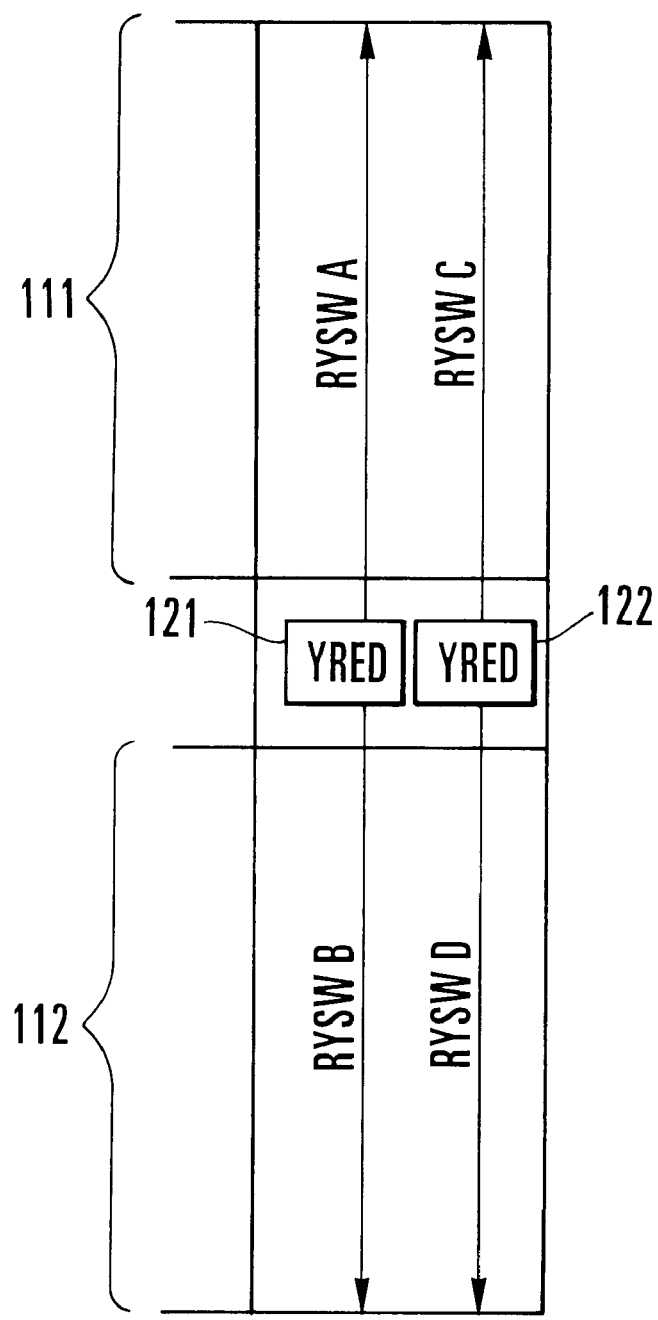
FIG. 5 is a diagram showing an example of the arrangement of a conventional semiconductor circuit having a redundancy function.

In the above embodiment, connection between the redundancy switch shared by the two different banks and the recovery lines in the banks is selected in accordance with defects generated in the banks. However, the present invention is not limited to this. For example, as shown in FIG. 3B, the bank 11 can be divided into two blocks (redundancy objects) 11A and 11B by address X, the divided blocks 11A and 11B can share the redundancy switch 20, and connection between the redundancy switch 20 and the recovery lines RYSWA and RYSWB in the blocks 11A and 11B can be selected in accordance with generated defects. FIG. 4 shows the arrangement of this redundancy switch 20 in correspondence with FIG. 2.

In FIG. 3A, the redundancy switch 20 is arranged between the banks 11 and 12, but may be arranged at the end of the bank 11 or 12. In FIG. 3B, the redundancy switch 20 is arranged between the blocks 11A and 11B, but may be arranged at the end of the block 11A or 11B.

As is apparent from the above description, according to the present invention, the redundancy switch is shared by a plurality of redundancy objects, and connection between the redundancy switch and the recovery lines in the redundancy objects is divisionally, independently performed by a plurality of redundancies in the redundancy switch. Defects generated in the redundancy objects are replaced with information of the recovery lines in the recovery objects connected to the redundancy switch, thereby recovering the defects. Redundancy in the two redundancy objects can recover defects twice the number of redundancy switches. Therefore, the redundancy efficiency can be increased without increasing the circuit area.

Flexibly connecting the redundancy switch to the recovery line poses a disadvantage in access due to a long distance between the redundancy switch and the recovery line. However, as in the present invention, when the redundancy switch is arranged between a plurality of redundancy objects on the same chip as the redundancy objects, the distance between the redundancy switch and the recovery line does not increase, and an access is free from any disadvantage.

What is claimed is:

1. A redundancy method comprising the steps of:
   sharing a redundancy switch between a plurality of redundancy memory objects having memory recovery lines;
   said redundancy switch divisionally and independently connecting to the memory recovery lines in the redundancy memory objects to replace defects generated in the redundancy memory objects with information of the memory recovery lines, and providing for replacement of a defect in each of the plurality of redundancy memory objects or replacement of a plurality of defects in one redundancy memory object,
   said redundancy switch comprising a plurality of redundancy connections, wherein each redundancy connection comprises a defective memory object selection which includes a least one AND gate providing for memory object selection, and a memory address selection which includes at least one AND gate providing for memory address selection; and
   replacing defects generated in the redundancy memory objects with information of the recovery lines which are connected by the redundancy switch, thereby recovering the defects.

2. A method according to claim 1, wherein the redundancy memory objects are memory banks.

3. A method according to claim 1, wherein the redundancy memory objects are memory blocks divided by an address.

4. A method according to claim 1, wherein the redundancy connections correspond respectively to upper and lower addresses in the redundancy memory objects.

5. A method according to claim 1, wherein each redundancy memory object is provided with only a single memory recovery line.

6. A semiconductor circuit comprising:
   a redundancy switch commonly arranged between a plurality of redundancy memory objects having memory recovery lines,
   said redundancy switch divisionally and independently connection to the recovery lines in the redundancy memory objects to replace defects generated in the redundancy memory objects with information of the memory recovery lines, and providing for replacement of a defect in each of the plurality of redundancy memory objects or replacement of a plurality of defects in one redundancy memory object,
   said redundancy switch comprising a plurality of redundancy connection means, wherein each redundancy connection means comprises a defective memory object selection means which includes at least one AND gate providing for memory object selection, and memory address selection means which includes at least one AND gate providing for memory address selection, to replace defects generated in the redundancy memory objects with information of the recovery lines which are connected by the redundancy switch, thereby recove ring the defects.

7. A circuit according to claim 6, wherein the redundancy memory objects are memory banks.

8. A circuit according to claim 6, wherein the redundancy memory objects are memory blocks divided by an address.

9. A circuit according to claim 6, wherein said redundancy switch is arranged between the plurality of redundancy memory objects on the same chip as the plurality of redundancy memory objects.

10. A circuit according to claim 6, wherein the plurality of redundancy connection means and the memory recovery lines are connected by disconnecting fuses.

11. A circuit according to claim 6, wherein the redundancy connection means corresponds respectively to upper and lower addresses in the redundancy memory objects.

12. A circuit according to claim 6, wherein each redundancy memory object has only a single memory recovery line.

* * * * *

UNITED STATES PATENT AND TRADEMARK OFFICE
CERTIFICATE OF CORRECTION

PATENT NO. : 6,061,281
DATED : May 9, 2000
INVENTOR(S) : Kyoichi Nagata

It is certified that error appears in the above-identified patent and that said Letters Patent are hereby corrected as shown below:

Column 3, Line 10: "④" should read --④'--

Column 3, Line 11: "and a to f" should read --two sets of fuses a to f--

Column 4, Line 49: "recove ring" should read --recovering--

Signed and Sealed this

Seventeenth Day of April, 2001

Attest:

NICHOLAS P. GODICI

Attesting Officer     Acting Director of the United States Patent and Trademark Office